(12) United States Patent
Yoshida

(10) Patent No.: US 6,275,744 B1
(45) Date of Patent: Aug. 14, 2001

(54) SUBSTRATE FEED CONTROL

(75) Inventor: Yasushi Yoshida, Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/126,427

(22) Filed: Jul. 30, 1998

(30) Foreign Application Priority Data

Aug. 1, 1997 (JP) .................................................. 9-220860

(51) Int. Cl.$^7$ ...................................................... G06F 7/00
(52) U.S. Cl. .......................... 700/218; 414/935; 414/937
(58) Field of Search ................................... 700/218, 213, 700/214; 414/937, 935, 939, 941; 438/908

(56) References Cited

U.S. PATENT DOCUMENTS

| | | | |
|---|---|---|---|
| 5,668,733 | * 9/1997 | Morimoto et al. | 364/488 |
| 5,900,105 | * 5/1999 | Toshima | 156/345 |
| 5,944,940 | * 8/1999 | Toshima | 156/345 |
| 5,993,614 | * 11/1999 | Nomura | 204/192.12 |

FOREIGN PATENT DOCUMENTS

| | | |
|---|---|---|
| 3-196948 | 8/1991 | (JP) . |
| 4-113612 | 4/1992 | (JP) . |
| 5-50369 | 3/1993 | (JP) . |
| 6-89934 | 3/1994 | (JP) . |

* cited by examiner

Primary Examiner—H. Grant Skaggs
Assistant Examiner—Khoi H. Tran
(74) Attorney, Agent, or Firm—Wenderoth, Lind & Ponack L.L.P.

(57) ABSTRACT

A substrate processing apparatus has a plurality of processing chamber groups including at least one processing chamber group of a plurality of processing chambers for identically processing substrates concurrently therein, and a substrate feeder for feeding substrates to each of the processing chamber groups. A value calculated by dividing times required to process substrates in the processing chambers and times required to feed substrates to the processing chambers, by the number of the processing chambers is set to a tact time, and substrates are loaded into the substrate processing apparatus at intervals of the tact time. A time equal to or greater than a time required for the substrate feeder to perform a feed job is established as a feed slot, and a plurality of feed slots are established in the tact time. Substrates are loaded into the substrate processing apparatus with the substrate feeder in timed relation to the feed slots.

6 Claims, 14 Drawing Sheets

SUBSTRATE FEED CONTROL

BACKGROUND OF THE INVENTION

1. Field of the Invention

The present invention relates to the art of controlling the feeding of substrates with respect to a plurality of processing chambers of a substrate processing apparatus such as a semiconductor fabrication apparatus for forming films on semiconductor substrates or an LCD (liquid crystal display) fabrication apparatus for forming films on glass substrates for LCD.

2. Description of the Related Art

One known substrate processing apparatus for successively processing substrates in a plurality of processing chambers finds its use as an LCD fabrication apparatus of the single-substrate in-line processing type which processes a substrate or a small number of substrates successively as shown in FIG. 17 of the accompanying drawings.

The LCD fabrication apparatus shown in FIG. 17 has an atmospheric substrate feeder T1 coupled to a loading cassette stand S1, an auxiliary substrate loading chamber L1 coupled to the atmospheric substrate feeder T1 by a gate valve LV1, a vacuum substrate feeder T2 coupled to the auxiliary substrate loading chamber L1 by a gate valve LV2, and an auxiliary substrate heating chamber H coupled to the vacuum substrate feeder T2.

A vacuum substrate feeder T3 is coupled to the auxiliary substrate heating chamber H by a gate valve LV3. First, second, and third film growing chambers R1, R2, R3 are coupled to the vacuum substrate feeder T3 by respective gate valves LV4, LV5, LV6.

A vacuum substrate feeder T4 is coupled to the third film growing chamber R3 by a gate valve LV7. Fourth and fifth film growing chambers R4, R5 are coupled to the vacuum substrate feeder T4 by respective gate valves LV8, LV9. A buffer chamber B1 is coupled to the vacuum substrate feeder T4. A vacuum substrate feeder T5 is coupled to the buffer chamber B1. Sixth, seventh, and eighth film growing chambers R6, R7, R8 are coupled to the vacuum substrate feeder T5 by respective gate valves LV10, LV11, LV12. A vacuum substrate chamber T6 is coupled to the eighth film growing chamber R8 by a gate valve LV13.

An auxiliary substrate unloading chamber L2 is coupled to the vacuum substrate chamber T6 by a gate valve LV14. An atmospheric substrate feeder T7 is coupled to the auxiliary substrate unloading chamber L2 by a gate valve LV15. An unloading cassette stand S2 is coupled to the atmospheric substrate feeder T7.

The vacuum substrate feeders are housed in feed chambers. The film growing chambers serve as processing chambers for growing films on substrates therein. The heating chamber serves as a chamber for heating a substrate therein. Therefore, the chambers of the LCD fabrication apparatus serve as processing chambers for processing substrates in predetermined fashions.

A substrate loaded into the LCD fabrication apparatus is processed in the processing chambers as it is fed successively therethrough by the feeders. After desired films have been formed on the substrate, the substrate is unloaded from the LCD fabrication apparatus.

The feeding of substrates successively through the processing chambers and the processing of those substrates in the processing chambers are controlled by a controller (not shown).

Efforts have been made to increase the throughput of the LCD fabrication apparatus. For example, identical films are formed on substrates in the first and second film growing chambers R1, R2. Since the same films are formed on the substrates in the two film growing chambers, the throughput can be increased when successive substrates are introduced into the LCD fabrication apparatus.

For such simultaneous processing, the substrates need to be fed into the first and second film growing chambers R1, R2 by the vacuum substrate feeder T3. Consequently, the vacuum substrate feeder T3 is subject to an conflict between feed job requirements for feeding substrates into the two film growing chambers simultaneously.

The LCD fabrication apparatus of the single-substrate in-line processing type takes up a relatively large installation space and is relatively expensive because it has many substrate feeders (seven feeders in FIG. 17). To eliminate these drawbacks, there have been employed substrate processing apparatus of the single-substrate cluster type in recent years.

The substrate processing apparatus of the single-substrate cluster type comprises a plurality of processing chambers coupled to a main frame which houses substrate feeders. Some of the processing chambers serve as film growing chambers for processing substrates identically, and substrates are fed into these film growing chambers by one substrate feeder.

Inasmuch as such one substrate feeder is required to feed many substrates into the respective film growing chambers, the substrate feeder is also subject to a feed job conflict in feeding substrates into the film growing chambers.

Such a feed job conflict can be avoided by setting up a suitable feed job schedule for establishing a sequence of individual feed jobs. However, unless a suitable feed job schedule is set up, a substrate may be exposed to an environment in which its temperature cannot properly be controlled for a long period of time, e.g., a substrate may remain gripped by the substrate feeder and stay in an undesirable temperature environment for a long period of time, and may be given an unwanted heating history, resulting in a reduction in substrate yield. This problem also arises with respect to the substrate processing apparatus of the single-substrate in-line processing type, but is more serious with the substrate processing apparatus of the single-substrate cluster type.

SUMMARY OF THE INVENTION

It is therefore an object of the present invention to control the feeding of substrates smoothly with a substrate feeder for a high throughput in view of time intervals at which substrates can be loaded into a substrate processing apparatus.

Another object of the present invention is to prevent substrates from staying undelivered undesirably in a substrate processing apparatus for thereby preventing substrate products from suffering a reduction in quality due to an undesirable heating history.

According to the present invention, a processing chamber or processing chambers for identically processing substrates are handled as a processing chamber group, and a substrate processing apparatus has a plurality of processing chamber groups including at least one processing chamber group of a plurality of processing chambers for identically processing substrates concurrently therein, and a substrate feeder for feeding substrates to each of the processing chamber groups. In order to prevent substrates successively loaded into the substrate processing apparatus from staying undelivered in the substrate processing apparatus, time intervals at which substrates are loaded into the substrate processing apparatus are considered, and times required to complete feed jobs to feed substrates are assigned to the feed jobs in association with the time intervals. The feed jobs are performed according to the assigned times.

Specifically, the sums of times required to process substrates in the processing chambers and times required to feed substrates to the processing chambers are divided by the number of the processing chambers included in the processing chamber groups, and a time equal to or greater than a maximum one of the calculated times of each chamber group is established as a tact time. Substrates to be processed are loaded into the substrate processing apparatus with the substrate feeder at intervals of the tact time.

The tact time thus determined is effective to prevent substrates successively loaded into the substrate processing apparatus from staying undelivered due to intervals at which they are loaded.

A time equal to or greater than a time required for the substrate feeder to perform a feed job is established as a feed slot, and a plurality of feed slots are established in the tact time, which substrates are fed to the processing chamber groups with the substrate feeder in timed relation to the feed slots.

The feed slots thus established in the tact time are effective to prevent substrates successively loaded into the substrate processing apparatus from staying undelivered due to intervals at which they are loaded, and also to prevent substrates successively fed to the processing chamber groups from staying undelivered in the substrate processing apparatus.

The tact time is set to a constant time for loading substrates into the substrate processing apparatus repeatedly at constant intervals. Therefore, a high-throughput substrate feed control process for preventing substrates from staying undelivered is repeatedly carried out while the substrate processing apparatus is in operation.

Constant timings are established to feed substrates to the processing chamber groups, and a constant sequence of feed jobs is established to feed substrates to the processing chamber groups. Consequently, substrates stay in the processing chambers for constant times, so that the amount of processing (e.g., the thicknesses of films produced in and heating histories imparted by the processing chambers) can accurately be controlled.

According to a specific process for achieving the above substrate feed control, a time equal to or greater than a time required for the substrate feeder to perform a feed job is established as a feed slot, and a feed job schedule of feed slots assigned to feed jobs with respect to the processing chamber groups is established in the tact time, after which substrates are loaded into the substrate processing apparatus with the substrate feeder in timed relation to the feed slots according to the feed job schedule.

The substrate feeder may comprise a robot arm for holding and feeding one substrate or a small number of substrates at a time. Different feed job schedules are employed depending on whether the substrate feeder has one or two holders (tweezers or end effectors on the robot arm).

Specifically, if the substrate feeder has a single holder, then there is established a sequence to feed a substrate to either one of the processing chambers of the first processing chamber group and feed a substrate from the either one of the processing chambers of the first processing chamber group to either one of the processing chambers of the second processing chamber group, the feed slots being arranged in a reversal of the sequence in the feed job schedule in each tact time. According to this sequence, the single holder is capable of feeding substrates successively downstream without staying undelivered by successively feeding substrates along feed paths from the downstream side thereof thereby to introduce a next substrate into a processing chamber after removal of a preceding substrate from the processing chamber.

According to a preferred process of establishing the feed slot, the tact time is divided by the time required for the substrate feeder to perform a feed job to determine an integer representing the maximum number of times that a feed job can be performed in one tact time, and the tact time is divided by the determined integer to determine the time equal to or greater than the time required for the substrate feeder to perform a feed job, after which the feed slot is set to the determined time.

Therefore, a feed job is carried out a required number of times within one tact time, and a sufficient time needed is kept for each feed job to allow the substrate feeder to feed substrates to the processing chamber groups. Furthermore, substrates are prevented from remaining held by the substrate feeder for a long period of time.

If the substrate feeder has at least two holders for holding and feeding substrates at a time, the two holders being alternately operable to introduce substrates into or remove substrates from respective ones of the processing chambers at a time in each feed slot, then there is established a sequence to feed a substrate to either one of the processing chambers of the first processing chamber group and feed a substrate from the either one of the processing chambers of the first processing chamber group to either one of the processing chambers of the second processing chamber group, the feed slots being arranged according to the sequence in the feed job schedule in each tact time. According to this sequence, the substrate feeder is capable of feeding substrates successively downstream by removing a preceding substrate from a processing chamber with one of the holders and then introducing a next substrate into the processing chamber in one feed job performed on the processing chamber.

Since the above feed job is performed by the substrate feeder with the two holders, it is preferable to add a time required to transmit a feed command to the substrate feeder to perform a feed job to the time required for the substrate feeder to perform the feed job, thereby minimizing the feed slot.

In this manner, each feed job can be performed within a short period of time to increase the time in which each substrate dwells in the processing chambers, for thereby preventing the substrate from suffering an unwanted heating history while being fed.

The substrate processing apparatus has another substrate feeder for loading substrates to be processed into the substrate processing apparatus and unloading processed substrates from the substrate processing apparatus. Feed slots for the other substrate feeder to load substrates into the substrate processing apparatus are added to the feed job schedule in each tact time, prior to feed slots for the other substrate feeder to unload substrates from the substrate processing apparatus. According to this feed job schedule, substrates are loaded into the substrate processing apparatus and unloaded from the substrate processing apparatus along feed paths from the upstream side thereof, so that substrates successively introduced into the substrate processing apparatus are prevented from staying undelivered.

Preferably, the feed job schedule is established so as to incorporate an inhibiting condition to inhibit feed jobs while the substrate processing apparatus is in operation. It is thus possible to establish a feed job schedule depending on structural details of the substrate processing apparatus such as the number of bins of a cassette for holding substrates, so that optimum substrate feed control optimum for the substrate processing apparatus can be carried out.

If each of the processing chambers comprises a film growing chamber for growing a film on a substrate, then the feed job schedule is preferably established so as to maximize the margin of a film growing chamber dwell time in which a substrate stays in each film growing chamber with respect to a film growing time, and also to maximize the sum of film growing chamber dwell times in the film growing chambers. With this feed job schedule, a sufficient time can be given to a film growing process whose process time is likely to change due to process preparations or the like. Therefore, the feed job schedule is highly reliable. Furthermore, substrates are prevented from suffering an undesirable heating history because they remain in film growing chambers whose temperature control is relatively easy to carry out, longer than in feed chambers whose temperature control is difficult to perform.

Preferably, each of the film growing chambers is controlled to maintain a constant temperature therein while a substrate processed therein is waiting for being fed from the film growing chamber. Therefore, any unwanted heating history to which substrates are subject is minimized for thereby forming high-quality films on substrates.

The above method according to the present invention can be carried out on the basis of tact times and feed slots that are calculated by the operator of the substrate processing apparatus. Preferably, however, the steps of the above method are specified by a program, and the program is installed in a controller (computer) which controls the substrate processing apparatus. Therefore, the method is automatically carried out when the substrate processing apparatus is controlled by the controller which runs the program.

The principles of the present invention are also applied to a method of manufacturing a substrate product, such as a semiconductor substrate having films grown thereon to product a semiconductor device or a glass substrate having films grown thereon to product an LCD. In this method, any unwanted heating history to which substrates are subject while being fed in the substrate processing apparatus is minimized, and a period of time in which substrates dwell in the processing chambers is maximized while achieving a high throughput, so that high-quality substrate products can be manufactured.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
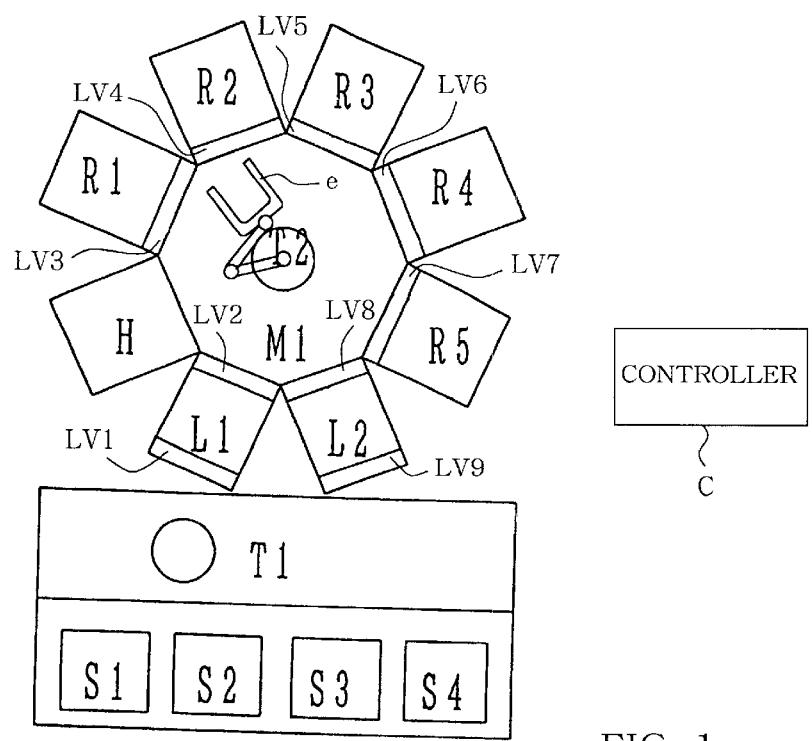
FIG. 1 is a schematic plan view of an LCD fabrication apparatus of the single-substrate cluster type according to first embodiment of the present invention.

Like or corresponding parts are denoted by like or corresponding reference characters throughout views.

FIG. 1 schematically shows an LCD fabrication apparatus of the single-substrate cluster type according to a first embodiment of the present invention. A controller C controls the LCD fabrication apparatus to control the feeding of substrates and the fabrication of substrate products in the LCD fabrication apparatus.

As shown in FIG. 1, the LCD fabrication apparatus has a first substrate feeder T1 comprising a robot arm coupled to cassette stands S1–S4 each for housing a plurality of substrates. An auxiliary substrate loading chamber L1 and an auxiliary substrate unloading chamber L2 are coupled to the first substrate feeder T1 by respective gate valves LV1, LV9. A main frame M1 for a cluster of chambers (described later on) is coupled to the auxiliary substrate loading chamber L1 and the auxiliary substrate unloading chamber L2 by respective gate valves LV2, LV8.

A second substrate feeder T2 comprising a robot arm is mounted on the main frame M1 for feeding substrates to various processing chambers coupled to the main frame M1. To the main frame M1, there are coupled an auxiliary substrate heating chamber H, a first film growing chamber R1 by a gate valve LV3, a second film growing chamber R2 by a gate valve LV4, a third film growing chamber R3 by a gate valve LV5, a fourth film growing chamber R4 by a gate valve LV6, and a fifth film growing chamber R5 by a gate valve LV7.

The first and second film growing chambers R1, R2 concurrently grow identical films on respective substrates therein. The third, fourth, and fifth growing chambers R3, R4, R5 concurrently grow identical films on respective substrates therein. The first and second film growing chambers R1, R2 belong to a first film growing chamber group, and the third, fourth, and fifth growing chambers R3, R4, R5 belong to a second film growing chamber group. Different films are grown on substrates in the first and second film growing chamber groups. The chambers L1, L2, H, R1–R5 jointly make up a cluster of chambers coupled to the main frame M1 and disposed around the second substrate feeder T2.

The first substrate feeder T1 serves to load substrates from the cassette stands S1–S4 into the cluster and unload processed substrates from the cluster into the cassette stands S1–S4.

The second substrate feeder T2 serve to load substrates into and unload substrates from the processing chambers L1, L2, H, R1–R5. The robot arm of the second substrate feeder T2 has an end effector e on its distal end. When the robot arm is turned, extended, and contracted, the end effector e holds and feeds a substrate into and out of either one of the processing chambers L1, L2, H, R1–R5. If the end effector e comprises a number of holder layers, it can hold and feed as many substrates as the number of holder layers.

The controller C establishes tact times defining time intervals at which the first substrate feeder T1 loads substrates into the cluster, i.e., the auxiliary substrate loading chamber L1, feed routes for feeding a substrate from a loading cassette stand through processing chambers to an unloading cassette stand, feed slots defining times for feeding substrates to the second substrate feeder T2 within tact times, and feed job schedules composed of feed slots assigned to feed routes, as described below. The controller C also controls the first and second substrate feeders T1, T2 to feed substrates in synchronism with the feed slots of the feed job schedules.

If the end effector e is a single substrate holder, then a tact time T of a film growing chamber group, such as the first growing chamber group (R1, R2) or the second growing chamber group (R3, R4, R5), for the second substrate feeder T2 to feed substrates to the film growing chambers concurrently parallel to each other is calculated according to the following equation (1):

$$AT \geq P+R+2B+3N \quad (1)$$

where

A: the number of parallel processing chambers to which substrate are fed concurrently;
T: tact time;
B: substrate feed time;
N: network communication time;
R: film growing process preparation time; and
P: film growing process time.

$$R = S+E$$

where

S: pressure control time; and
E: exhaust time.

Figure 2:
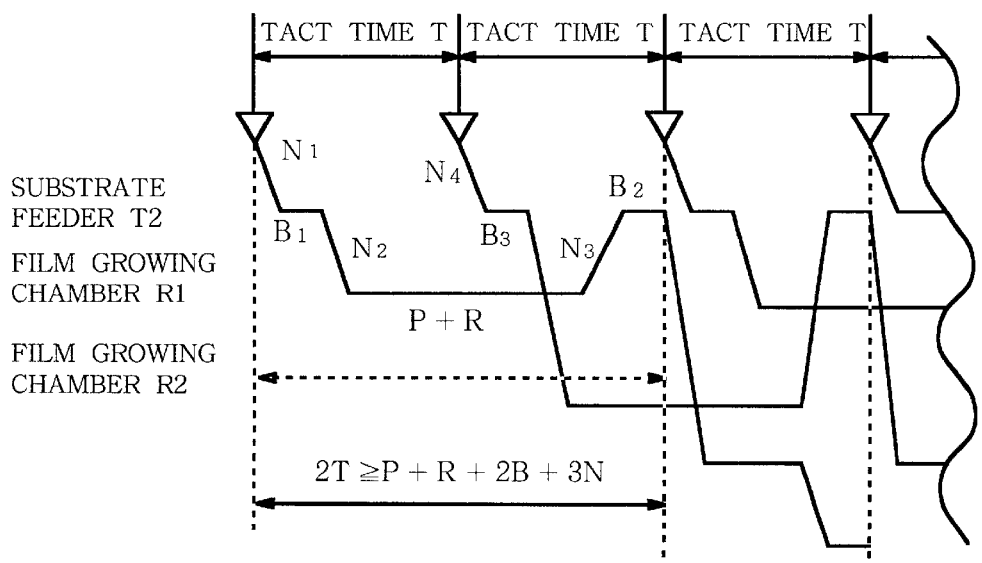
FIG. 2 is a timing chart of the calculation of tact times.

With respect to the first film growing chamber group (R1, R2) and the second substrate feeder T2, the equation (1) is determined as shown in FIG. 2.

It is assumed that N1, N3 represent times required to transmit a feed command from the controller C to the second substrate feeder T2, B1, B2 times required for the second substrate feeder T2 to complete a feeding operation based on a feed command, N2 a time required to transmit a film growth command from the controller C to the first film growing chamber R1, and P+R a time required for the first film growing chamber R1 to execute and complete a film growing process. It is also assumed that N1=N2=N3=N and B1=B2=B.

With respect to the feeding of a substrate to the first film growing chamber R1, since the first film growing chamber group is composed of two film growing chambers, a maximum time of 2T is consumed until a next substrate is fed to the first film growing chamber R1. Therefore, the feeding of a substrate to the first film growing chamber R1 with the second substrate feeder 2T and then the feeding of a processed substrate from the first film growing chamber R1 to either one of the film growing chambers (R3–R5) of the second film growing chamber group need to be effected within two tact times (2T). Therefore, 2T≧N1+B1+N2+P+R+N3+B2=P+R+2B+3N. Generalizing this with the number A of parallel processing chambers results in the above equation (1).

In a specific example, it is assumed that the film growing process time in each of the first and second film growing chambers R1, R2 is 110 seconds, the film growing process time in each of the third, fourth, and fifth film growing chambers R3, R4, R5 is 260 seconds, the film growing process preparation time R is 30 seconds, the substrate feed time B is 20 seconds, and the network communication time N is 1 second.

A tact time T of the first film growing chamber group composed of the first and second film growing chambers R1, R2 (A=2) is calculated according to the equation (1) as follows:

$$2T \geq 110+30+2\times 20+3\times 1$$

$$\geq 140+40+3$$

$$\geq 183.$$

Therefore, T≧91.5 seconds.

A tact time T of the second film growing chamber group composed of the third, fourth, and fifth film growing chambers R3, R4, R5 (A=3) is calculated according to the equation (1) as follows:

$$3T \geq 260+30+2\times 20+3\times 1$$

$$\geq 290+40+3$$

$$\geq 333.$$

Therefore, T≧111 seconds.

The maximum tact time of these calculated tact times is 111 seconds of the second film growing chamber group composed of the third, fourth, and fifth film growing chambers R3, R4, R5.

This maximum tact time of 111 seconds is used as a tact time T for loading a substrate to be processed into the LCD fabrication apparatus. Substrates are successively fed to the auxiliary substrate loading chamber L1 by the first substrate feeder T1 at intervals of the tact time T (111 seconds).

As described above, a tact time for loading a substrate into the LCD fabrication apparatus is determined on the basis of the time required for a film growing chamber group to process substrates, and substrates are loaded from the cassette stands S1–S4 into the LCD fabrication apparatus successively at intervals of the determined tact time. In this manner, substrates can smoothly be fed into the LCD fabrication apparatus and can also smoothly be processed in the LCD fabrication apparatus.

Stated otherwise, the time (P+R+2B+3N) required to grow film on a substrate in a film growing chamber of a film growing chamber group in which substrates are processed concurrently in its film growing chambers and also required to feed a substrate to the film growing chamber is divided by the number (A) of the film growing chambers. In this manner, times required by respective film growing chamber groups are determined, and a time which is equal to or greater than a maximum one of the determines times is used as a tact time. Substrates are then loaded into the LCD fabrication apparatus successively at intervals of the tact time. A film can now reliably be grown on each of the substrates thus loaded in any of the film growing chambers of the film growing chamber groups. As a result, any loaded substrates are prevented from waiting for a film growing process while it is being fed in the LCD fabrication apparatus, and can be fed smoothly without staying undelivered.

With the tact time thus established for loading substrates into the LCD fabrication apparatus, the second substrate feeder T2 needs to perform a plurality of feed jobs in one tact time. As a consequence, if the second substrate feeder T2 starts feeding a substrate processed in each film growing chamber to a next film growing chamber when a film growing process is finished, then the second substrate feeder T2 possibly suffers an conflict between substrate feed jobs.

It is important to establish a schedule of feed jobs for the second substrate feeder T2 to perform in one tact time.

Figure 3:
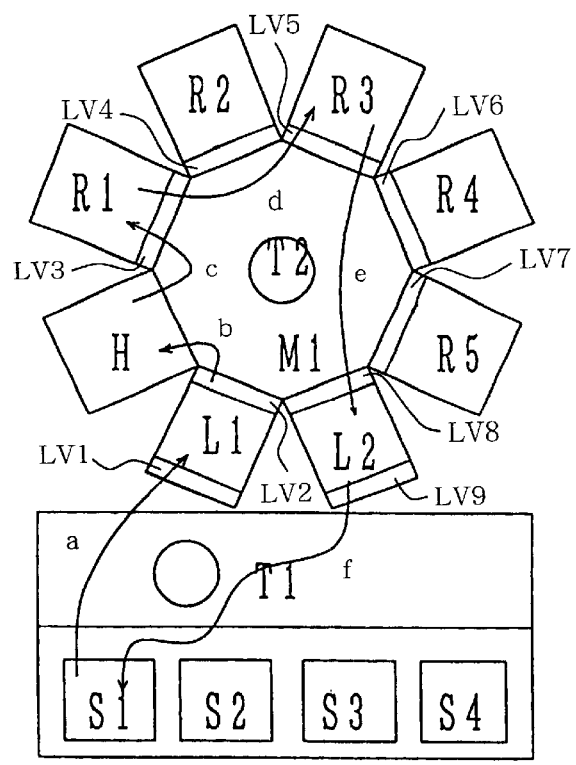
FIG. 3 is a schematic plan view showing substrate feed paths of the LCD fabrication apparatus of the single-substrate cluster type shown in FIG. 1.

FIG. 3 shows substrate feed paths for a substrate in the LCD fabrication apparatus. These substrate feed paths include a substrate feed path "a" for the first substrate feeder T1 to feed a substrate from either one of the cassette stands S1–S4 (hereinafter referred to as "cassette stand S") to the auxiliary substrate loading chamber L1, a substrate feed path "b" for the second substrate feeder T2 to feed a substrate from the auxiliary substrate loading chamber L1 to the auxiliary substrate heating chamber H, a substrate feed path "c" for the second substrate feeder T2 to feed a substrate from the auxiliary substrate heating chamber H to either one of the first and second film growing chambers R1, R2 of the first film growing chamber group, a substrate feed path "d" for the second substrate feeder T2 to feed a substrate from either one of the first and second film growing chambers R1, R2 to either one of the third, fourth and fifth film growing chambers R3, R4, R5 of the second film growing chamber group, a substrate feed path "e" for the second substrate feeder T2 to feed a substrate from either one of the third, fourth and fifth film growing chambers R3, R4, R5 to the auxiliary substrate unloading chamber L2, and a substrate feed path "f" for the first substrate feeder T1 to feed a substrate from the auxiliary substrate unloading chamber L2 to the cassette stand S.

Combinations of these substrate feed path "a"–"f" will be described in specific detail below. As shown in Table 1 below, there are six feed routes available using these substrate feed path "a"–"f".

TABLE 1

| | | Feed paths | | | | |
|---|---|---|---|---|---|---|
| | Routes | T1 | T2 | | | T1 |
| No. | Feed | a | b | c | d | e | f |
| 1 | 1 | S→L1 | →H | →R1 | →R3 | →L2 | →S |
| 2 | 2 | S→L1 | →H | →R2 | →R4 | →L2 | →S |
| 3 | 3 | S→L1 | →H | →R1 | →R5 | →L2 | →S |
| 4 | 4 | S→L1 | →H | →R2 | →R3 | →L2 | →S |
| 5 | 5 | S→L1 | →H | →R1 | →R4 | →L2 | →S |
| 6 | 6 | S→L1 | →H | →R2 | →R5 | →L2 | →S |

One basic feed route extends from the cassette stand S to the auxiliary substrate loading chamber L1 to the auxiliary substrate heating chamber H (where the substrate is heated) to one of the first and second film growing chambers R1, R2 of the first film growing chamber group (wherein a first film is grown on the substrate) to one of the third, fourth, and fifth film growing chambers R3, R4, R5 of the second first film growing chamber group (wherein a second film is grown on the substrate) to the auxiliary substrate unloading chamber L2 back to the cassette stand S.

These sixth feed routes are successively switched in each tact time, i.e., each time a substrate is loaded, by the controller C, and the first and second substrate feeders T1, T2 feed substrates along the selected feed paths.

For example, a substrate loaded in a first tact time is fed along the feed route 1, and a substrate loaded in a next tact time is fed along the feed route 2. In this manner, the feed routes 1–6 are successively switched in respective successive tact times.

The first substrate feeder T1 handles the feed paths "a", "f", and the second substrate feeder T2 handles the feed paths "b"–"e". The second substrate feeder T2 repeats a feeding operation to feed a substrate to either one of the first and second film growing chambers R1, R2, and thereafter feed a substrate to either one of the third, fourth, and fifth film growing chambers R3, R4, R5.

By feeding substrates successively through the above six feed routes, substrates are loaded alternately into processing chambers of the first and second groups, so that the processing chambers of the first and second groups are efficiently used equally frequently for manufacturing substrate products with high chamber availability. However, effecting only the feeding operation according to the above feed routes causes the second substrate feeder T2 to suffer a feed job conflict due to simultaneous feed jobs needed to be performed with respect to a plurality of processing chambers.

To avoid such a feed job conflict for smoothly feeding substrates to processing chambers, the controller C determines feed job schedules for the first and second substrate feeders T1, T2 to perform their feed jobs, and controls the first and second substrate feeders T1, T2 according to the determined feed job schedules.

For sufficiently growing films on substrates in any film growing chambers, the controller C establishes feed job schedules so as to maximize the margin of a time in which a substrate stays in a film growing chamber (film growing chamber dwell time) with respect to a film growing time, and also maximize the sum of film growing chamber dwell times in the film growing chambers. If the film growing chamber dwell time is extended, then a substrate remains held by the substrate feeder and stays undelivered outside of the film growing chamber for a shortened time. Since the substrate is maintained longer in the film growing chamber in which a relatively stable temperature environment is developed, even when no film growth is effected therein, the substance is prevented from suffering an undesirable heating history.

The controller C determines optimum feed job schedules for maximizing the film growing chamber dwell time as follows:

Since the second substrate feeder T2 performs four feed jobs and the first substrate feeder T1 performs two feed jobs in each feed route, the controller C first determines a feed job schedule for the second substrate feeder T2 and thereafter selects a feed job schedule for the first substrate feeder T1 to match the feed job schedule for the second substrate feeder T2.

First, the controller C determines an optimum feed job schedule based on the concept of permutations according to Theorems 1 and 2 below.

Theorem 1:

The total number of permutations of n different things taken r at a time is expressed by:

$$n^P r = n(n-1)(n-2) \ldots (n-r+1).$$

If r=n, then it is expressed by:

$$n^P n = n(n-1)(n-2) \ldots 3 \cdot 2 \cdot 1 = n!$$

If r<n, then it is expressed by:

$$_nP_r = \{n(n-1) \ldots (n-r+1)(n-r) \ldots 2 \cdot 1\}/\{(n-r) \cdot 2 \cdot 1\}$$

$$= n!/(n-r)!$$

When r=n, the denominator of the right-hand side of the equation is 0!. In order to make the equation meaningful when r=n, it is defined that 0!=1.

Theorem 2:

When there are p elements a, q elements b, ... and d elements s, totaling n things, the total number of permutations of these things taken all at a time is expressed by:

$$n!/(p!q! \ldots s!)(n=p+q+ \ldots +s)$$

If a tact time representing intervals at which to load substrates into the LCD fabrication apparatus is indicated by T, a unit substrate feed time by B, and a network communication time by N, then the number m of times that a feed job can be performed in one tact time, i.e., the number m of feed slots, is expressed by m=T/(B+N) if the LCD fabrication apparatus is of the single-substrate cluster type.

As described later on, the number m is an integer with all the fractions omitted.

If the number of feed jobs "a", "b", "c", ... which have to be performed in one tact time is represented by n, then the following equation is derived by starting a feed job with loading a substrate into the auxiliary substrate loading chamber L1 in each tact time:

The total number M of permutations of feed job schedules is expressed by:

$$M = (_mP_m/(m-n) _P(m-n))/m$$

$$= (m!/(m-n)!)/m$$

$$= (m-1)!/(m-n)!$$

The above condition is applied to a specific example as follows: If the tact time T is 111 seconds as determined above, the substrate feed time B is 20 seconds, and the network communication time N is 1 second, then the number m of feed slots is calculated as 111/(20+1)=5.286.

Omitting all the fractions, the number m of feed slots is m=5. Using the number m of feed slots, feed slots are calculated as 111/5=22.2 seconds, and 22.2 seconds are assigned to each of feed jobs performed by the second substrate feeder T2.

Since the number m of feed slots is converted into an integer, slightly reducing the number of feed jobs that can be performed in one tact time, i.e., the maximum integral number, feed slots are made slightly longer for thereby giving a time margin to each feed job.

The feed jobs performed by the second substrate feeder T2 are indicated by "b", "c", "d", "e" and slots free of feed jobs are indicated by "R" (rest) Combinations of these feed jobs and slots are calculated as (5−1)!/(5−4)!=(4×3×2×1)/1=24, and shown in Table 2 below.

TABLE 2

| No. | Combinations | No. | Combinations | No. | Combinations | No. | Combinations |
|---|---|---|---|---|---|---|---|
| 1 | bcdeR | 7 | bdceR | 13 | becdR | 19 | bRcde |
| 2 | bcdRe | 8 | bdcRe | 14 | becRd | 20 | bRced |
| 3 | bcedR | 9 | bdecR | 15 | bedcR | 21 | bRdce |
| 4 | bceRd | 10 | bdeRc | 16 | bedRc | 22 | bRdec |
| 5 | bcRde | 11 | bdRce | 17 | beRcd | 23 | bRecd |
| 6 | bcRed | 12 | bdRec | 18 | beRdc | 24 | bRedc |

In this embodiment, those of the combinations shown in Table 2 which are not detrimental to the execution of the substrate feed control are selected in view of the actual structural arrangement of the LCD fabrication apparatus.

Specifically, feed jobs that are inhibited in view of the actual structural arrangement of the LCD fabrication apparatus are entered in the controller C, and the controller C omits combinations with those inhibited feed jobs and selected only those combinations of feed jobs that can be performed.

The inhibited feed jobs in this embodiment are shown in Table 3 below. Because of the inhibited feed jobs, there are only nine combinations of feed jobs "b", "c", "d", "e" that can be performed as indicated by "o" in Table 4 below.

TABLE 3

| Inhibited feed job No. | Inhibited combination | Reasons for inhibition |
|---|---|---|
| 1 | bc | Vertical movement of the chamber H is not quick enough because of the feed mechanism. |
| 2 | c is prior to d | The film growing chamber dwell time is equal to or less than the tact time. |
| 3 | d is prior to e | The film growing chamber dwell time is equal to or less than the tact time. |

TABLE 4

| Combinations | A | B | Combinations | A | B | Combinations | A | B | Combinations | A | B |
|---|---|---|---|---|---|---|---|---|---|---|---|
| bcdeR | 1 | x | bdceR | — | o1 | becdR | 2 | x | bRcde | 3 | x |
| bcdRe | 1 | x | bdcRe | — | o2 | becRd | 2 | x | bRced | 2 | x |
| bcedR | 1 | x | bdecR | 3 | x | bedcR | — | o5 | bRdce | — | o8 |
| bceRd | 1 | x | bdeRc | 3 | x | bedRc | — | o6 | bRdec | 3 | x |
| bcRde | 1 | x | bdRce | — | o3 | beRcd | 2 | x | bRecd | 2 | x |
| bcRed | 1 | x | bdRec | — | o4 | beRdc | — | o7 | bRedc | — | o9 |

A: Inhibition No.
B: Acceptable (o) or not acceptable (x)

Acceptable combinations in Table 4 are numbered, film growing chamber dwell times determined by the controller C are shown in Table 5 below.

TABLE 5

| Feed job | | Max. film growing chamber dwell time (sec.) | | | | |
|---|---|---|---|---|---|---|
| C | schedules | R1 | R2 | R3 | R4 | R5 | D |
| 1 | b→d→c→e→R | 178.8 | 178.8 | 245.4 | 245.4 | 245.4 | 7 |
| 2 | b→d→c→R→e | 178.8 | 178.8 | 267.6 | 267.6 | 267.6 | 4 |
| 3 | b→d→R→c→e | 156.6 | 156.6 | 267.6 | 267.6 | 267.6 | 6 |
| 4 | b→d→R→e→c | 134.4 | 134.4 | 245.4 | 245.4 | 245.4 | 9 |
| 5 | b→e→d→c→R | 178.8 | 178.8 | 289.8 | 289.8 | 289.8 | 1 |
| 6 | b→e→d→R→c | 156.6 | 156.6 | 289.8 | 289.8 | 289.8 | 3 |
| 7 | b→e→R→d→c | 178.8 | 178.8 | 267.6 | 267.6 | 267.6 | 4 |
| 8 | b→R→d→c→e | 178.8 | 178.8 | 245.4 | 245.4 | 245.4 | 7 |
| 9 | b→R→e→d→c | 178.8 | 178.8 | 289.8 | 289.8 | 289.8 | 1 |

C: Feed job schedule No.
D: Maximum film growing chamber dwell time rank

In this embodiment, the film growing process time in each of the first and second film growing chambers R1, R2 is 110 seconds, the film growing process time in each of the third, fourth, and fifth film growing chambers R3, R4, R5 is 260 seconds. Therefore, the controller C excludes those feed job schedules whose film growing chamber dwell times shown in Table 5 are shorter than the film growing process times. Specifically, the film growing chamber dwell time in the third, fourth, and fifth film growing chambers R3, R4, R5 according to the feed job schedules Nos. 1, 4, 8 is 245.4 seconds which is shorter than 260 seconds. Since no film can successfully be grown on films in the film growing chamber dwell time of 245.4 seconds, the controller C does not employ the feed job schedules Nos. 1, 4, 8.

FIGS. 4–9 are timing charts of the feed job schedules Nos. 2, 3, 5, 6, 7, 9 shown in Table 5.

The controller C then determines that the feed job schedule No. 5 or No. 9 in Table 5 is an optimum feed job schedule according to which the dwell time in each individual film growing chamber is long enough to cover the film growing process time and the sum of the dwell times in all the film growing chambers is the longest (1227 seconds), as described below.

The sum of the dwell times in all the film growing chambers is 1227 seconds according to the feed job schedules Nos. 5 and 9. According to the feed job schedules Nos. 5 and 9, the difference between the film growing chamber dwell time and the film growing process time is 178.8−110= 68.8 seconds for the film growing chambers R1, R2, and 289.8−260=29.8 seconds for the film growing chambers R3, R4, R5. These differences are greatly different from those according to the other feed job schedules Nos. 2, 3, and 7. According to the feed job schedules Nos. 5 and 9, therefore, the dwell time in each individual film growing chamber is long enough to cover the film growing process time.

According to the feed job schedules Nos. 5 and 9, substrates are successively fed upstream along feed paths into the LCD fabrication apparatus and delivered therein smoothly without staying undelivered.

Figure 10:
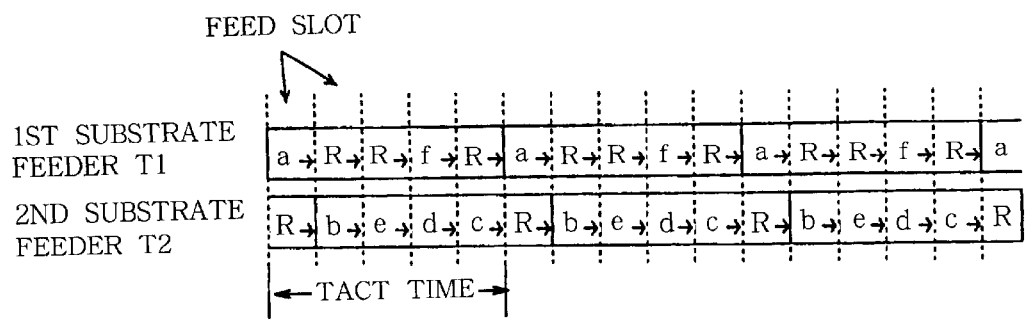
FIG. 10 is a diagram of feed job schedules.
Figure 4:
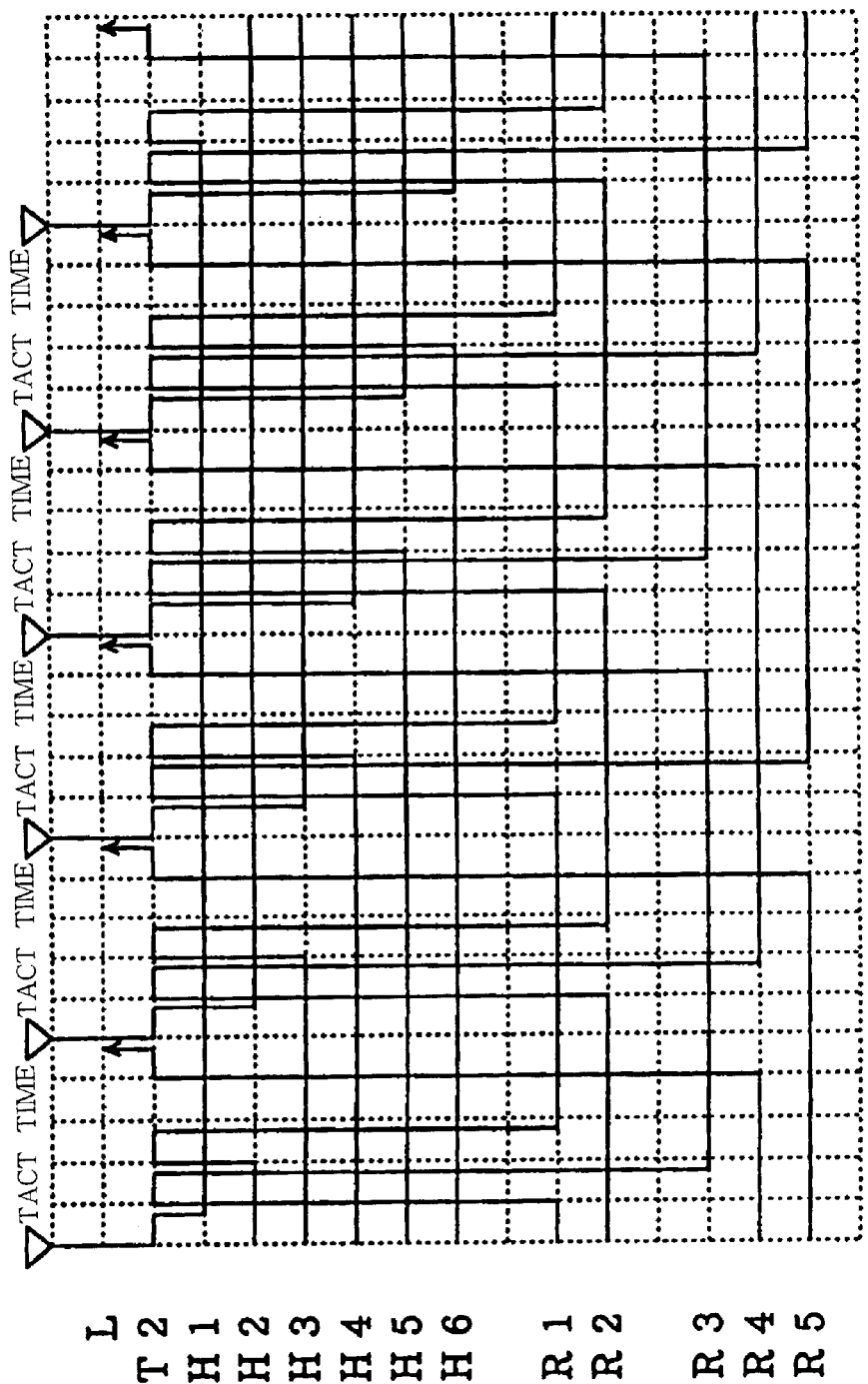
FIG. 4 is a timing chart of a feeding process based on a feed job schedule.
Figure 5:
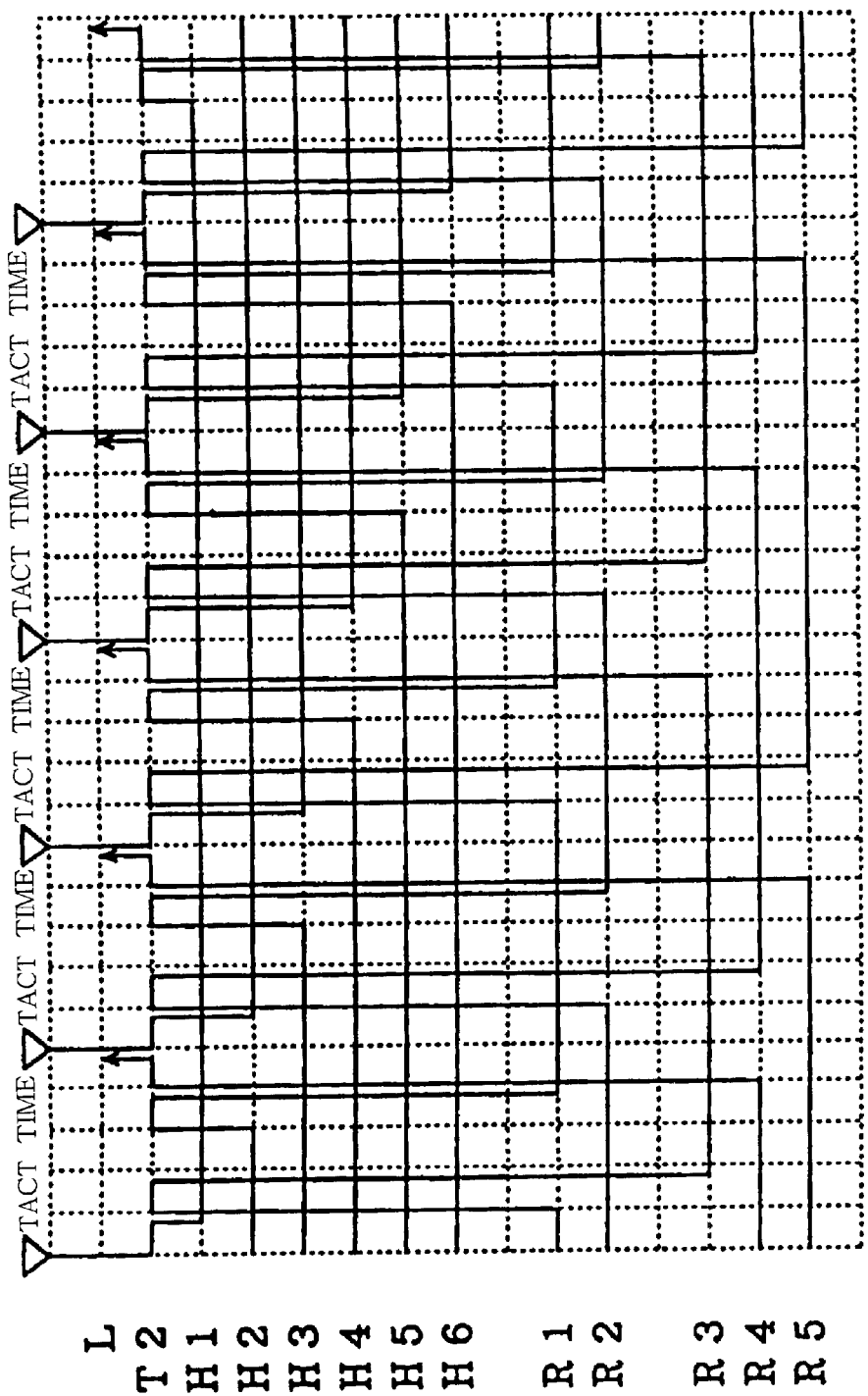
FIG. 5 is a timing chart of a feeding process based on a feed job schedule.
Figure 6:
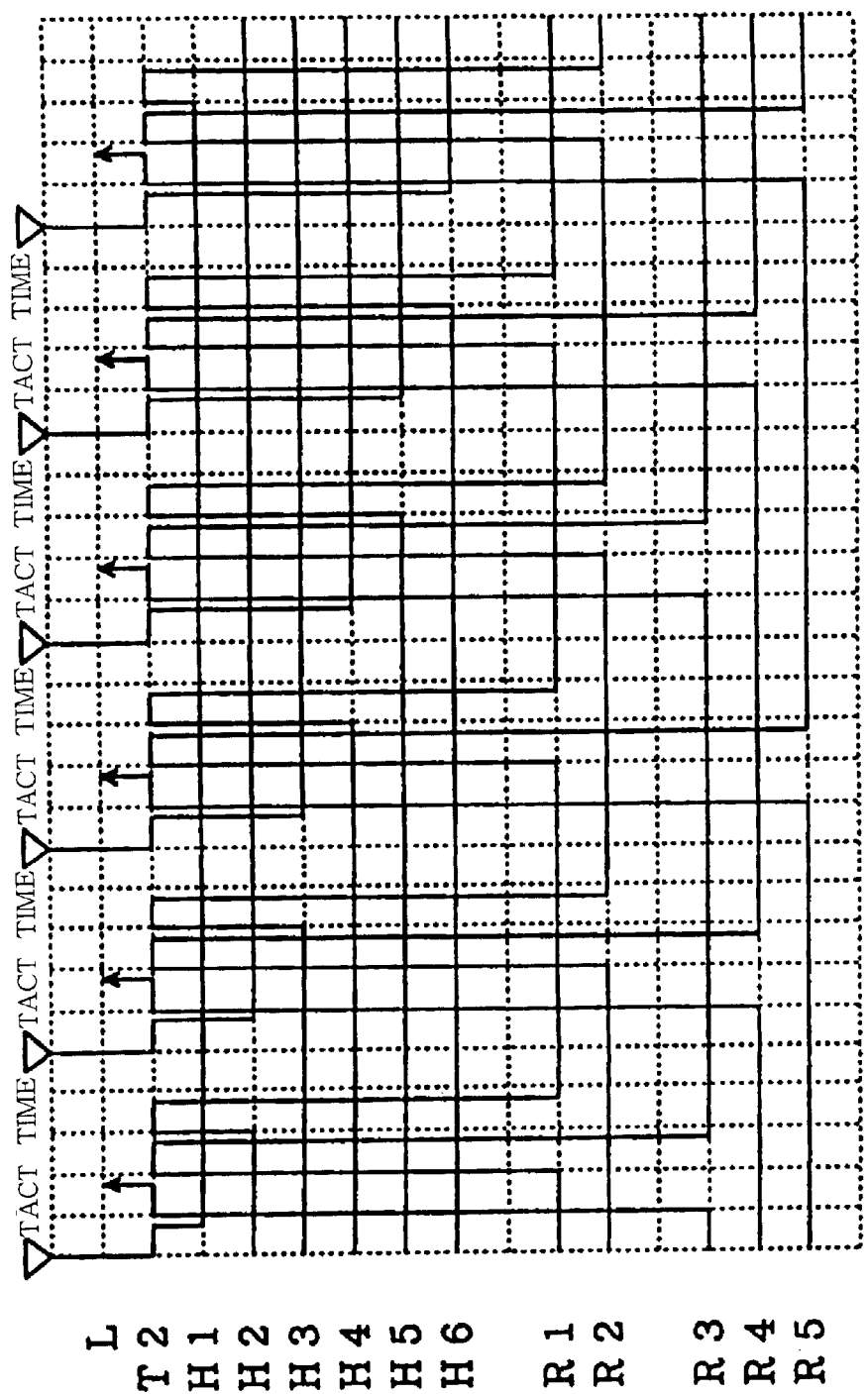
FIG. 6 is a timing chart of a feeding process based on a feed job schedule.
Figure 7:
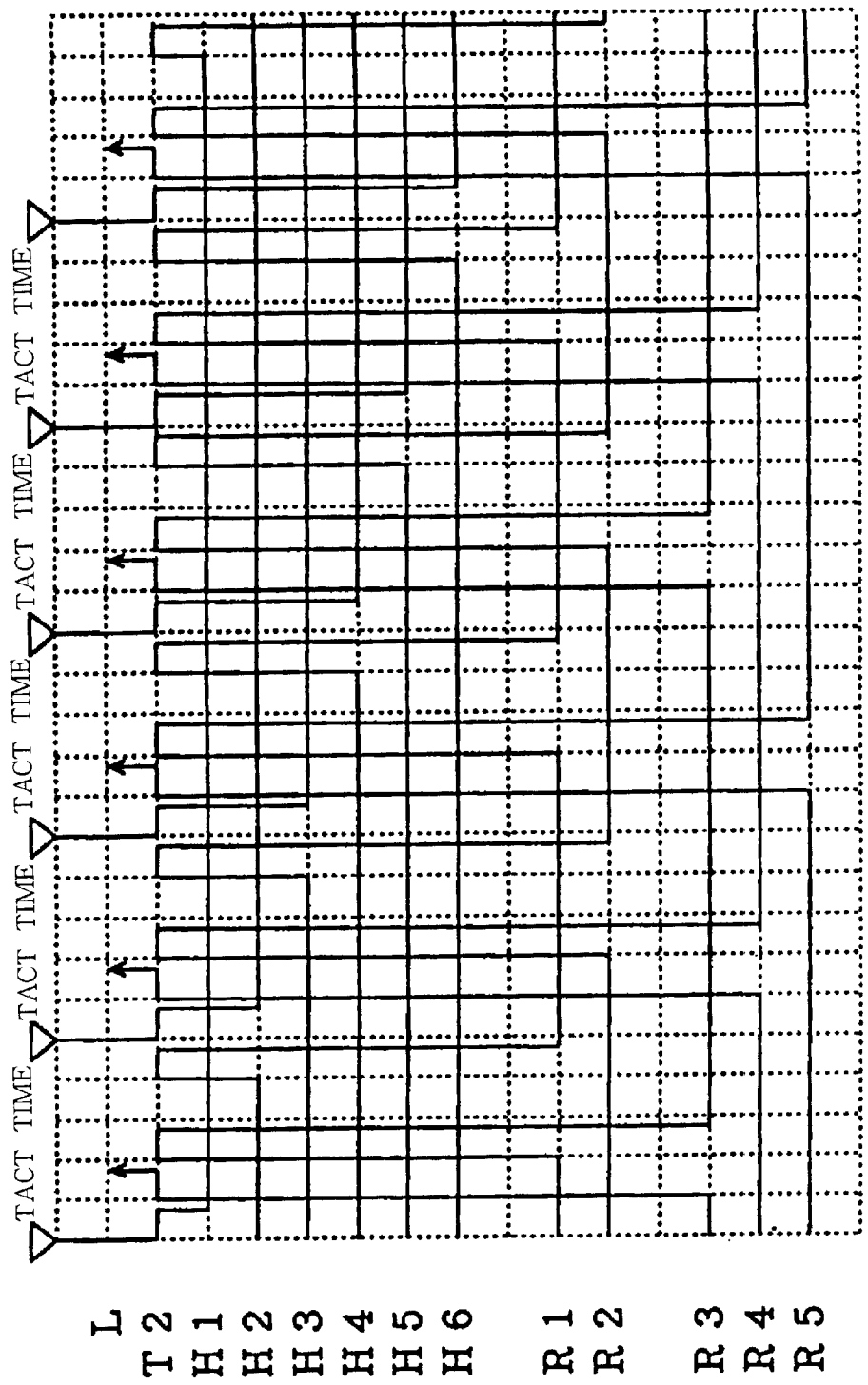
FIG. 7 is a timing chart of a feeding process based on a feed job schedule.
Figure 8:
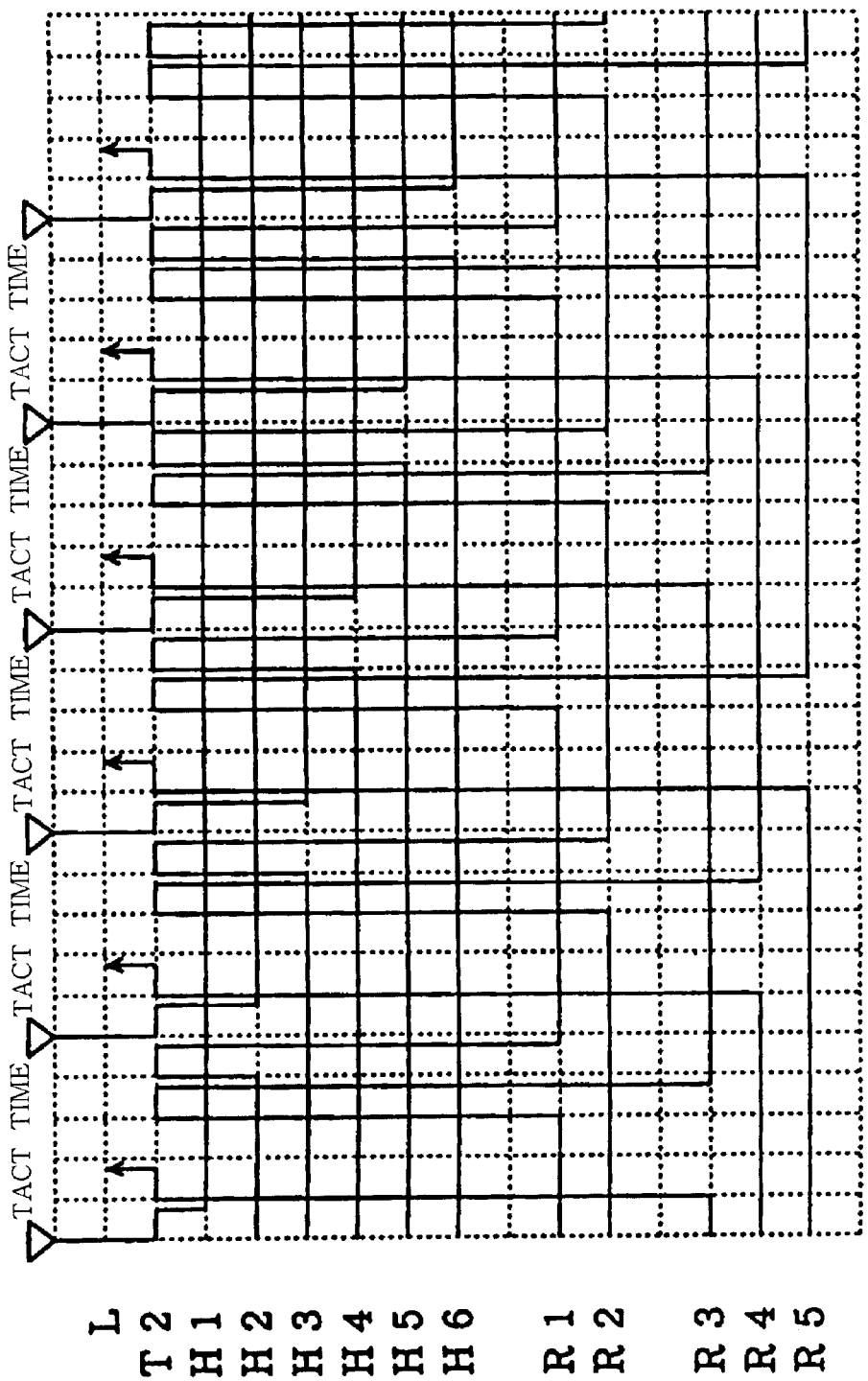
FIG. 8 is a timing chart of a feeding process based on a feed job schedule.
Figure 9:
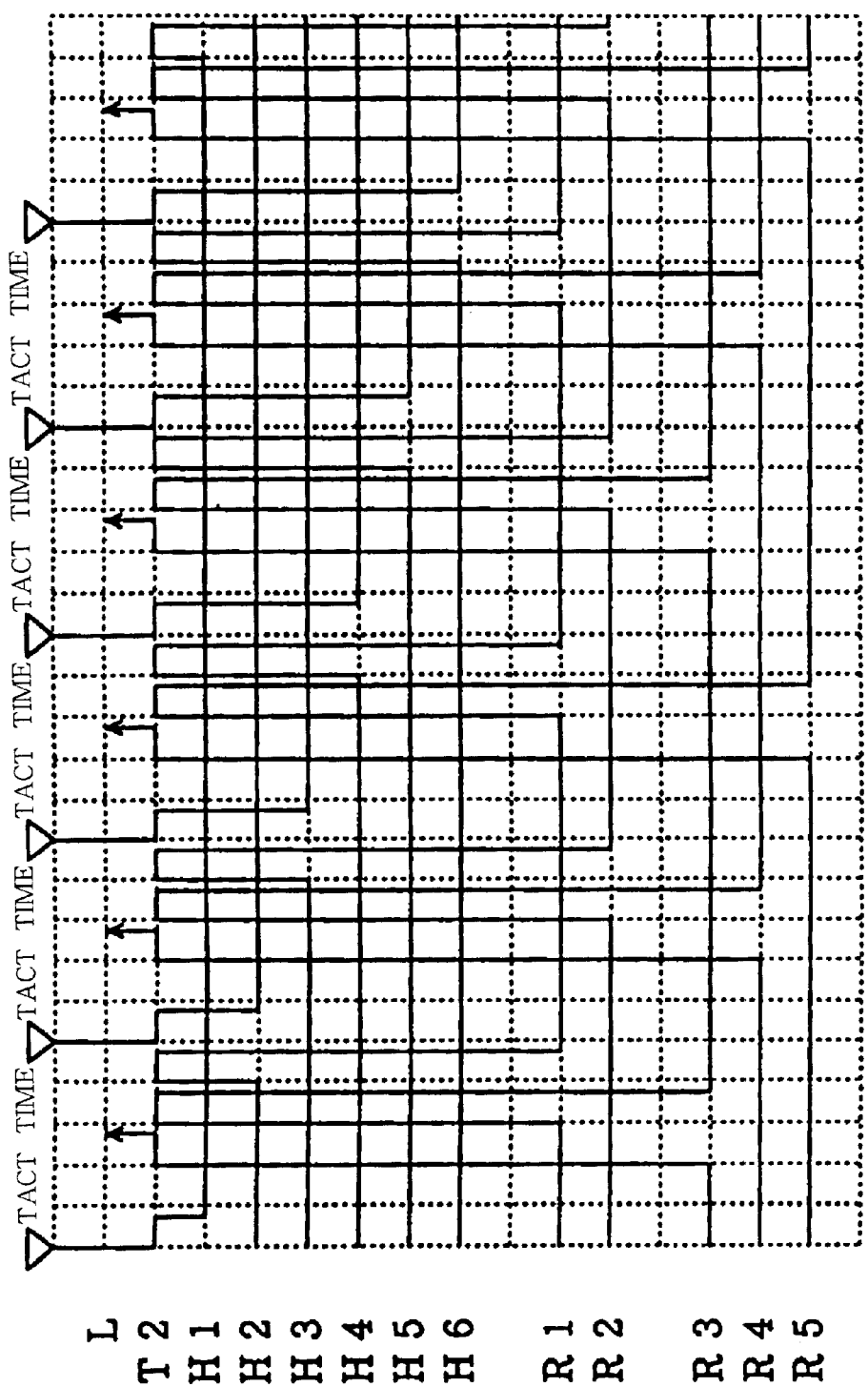
FIG. 9 is a timing chart of a feeding process based on a feed job schedule.

As shown in FIG. 10 which illustrates the feed job schedule No. 5, the controller C determines the feed job schedules of the first and second substrate feeders T1, T2 such that the feed job "a" of the first substrate feeder T1 is performed prior to the feed job "b" of the second substrate feeder T2 in order to avoid a substrate shortage in the auxiliary substrate loading chamber L1, and the feed job "f" of the first substrate feeder T1 is performed subsequent to the feed job "e" of the second substrate feeder T2 in order to prevent substrates from staying undelivered in the auxiliary substrate unloading chamber L2.

Since the feed slot for the feed job "a" for the first substrate feeder T1 to load a substrate into the LCD fabrication apparatus is arranged prior to the feed slot for the feed job "f" for the first substrate feeder T1 to unload a substrate from the LCD fabrication apparatus, substrates to be processed are loaded into the LCD fabrication apparatus and processed substrates are unloaded from the LCD fabrication apparatus along feed paths from the downstream end without staying undelivered in the LCD fabrication apparatus.

The first and second substrate feeders T1, T2 are controlled by the controller C to repeat their feed jobs according to their feed job schedules. The first and second substrate feeders T1, T2 start their feed jobs in timed relation to the feed slots.

Specifically, in the example shown in FIG. 10, the first substrate feeder T1 feeds a substrate from the cassette stand S to the auxiliary substrate loading chamber L1 (the feed job "a") in the first feed slot, the second substrate feeder T2 feeds a substrate from the auxiliary substrate loading chamber L1 to the auxiliary substrate heating chamber H (the feed job "b") in the next feed slot, and the second substrate feeder T2 feeds a substrate from either one of the third, fourth, and fifth growing chambers R3, R4, R5 to the auxiliary substrate unloading chamber L2 (the feed job "e") in the next feed slot. Then, the second substrate feeder T2 feeds a substrate from either one of the first and second film growing chambers R1, R2 to either one of the third, fourth, and fifth growing chambers R3, R4, R5 (the feed job "d"), and the first substrate feeder T1 feeds a substrate from the auxiliary substrate unloading chamber L2 to the cassette stand S (the feed job "f") in the next feed slot. In the next feed slot, the second substrate feeder T2 feeds a substrate from the auxiliary substrate heating chamber H to either one of the first and second film growing chambers R1, R2 (the feed job "c")

Because the first and second substrate feeders T1, T2 repeat their feed jobs according to the feed job schedules in timed relation to the feed slots in each tact time, the first and second substrate feeders T1, T2 can feed substrates without a feed job conflict while preventing substrates from staying undelivered and hence from suffering an unwanted heating history, at intervals of the tact time for loading substrates into the LCD fabrication apparatus.

In a film growing chamber whose film growing process time is shorter, the film growing process is finished prior to a next feed slot. Since the processed substrate is maintained in such a film growing chamber until the next feed slot starts, the substrate is prevented from suffering an unwanted heating history. While the processed substrate is held in the film growing chamber, the controller C controls the film growing chamber to keep a certain constant temperature therein for maintaining the substrate in a better heating history condition.

Figure 11:
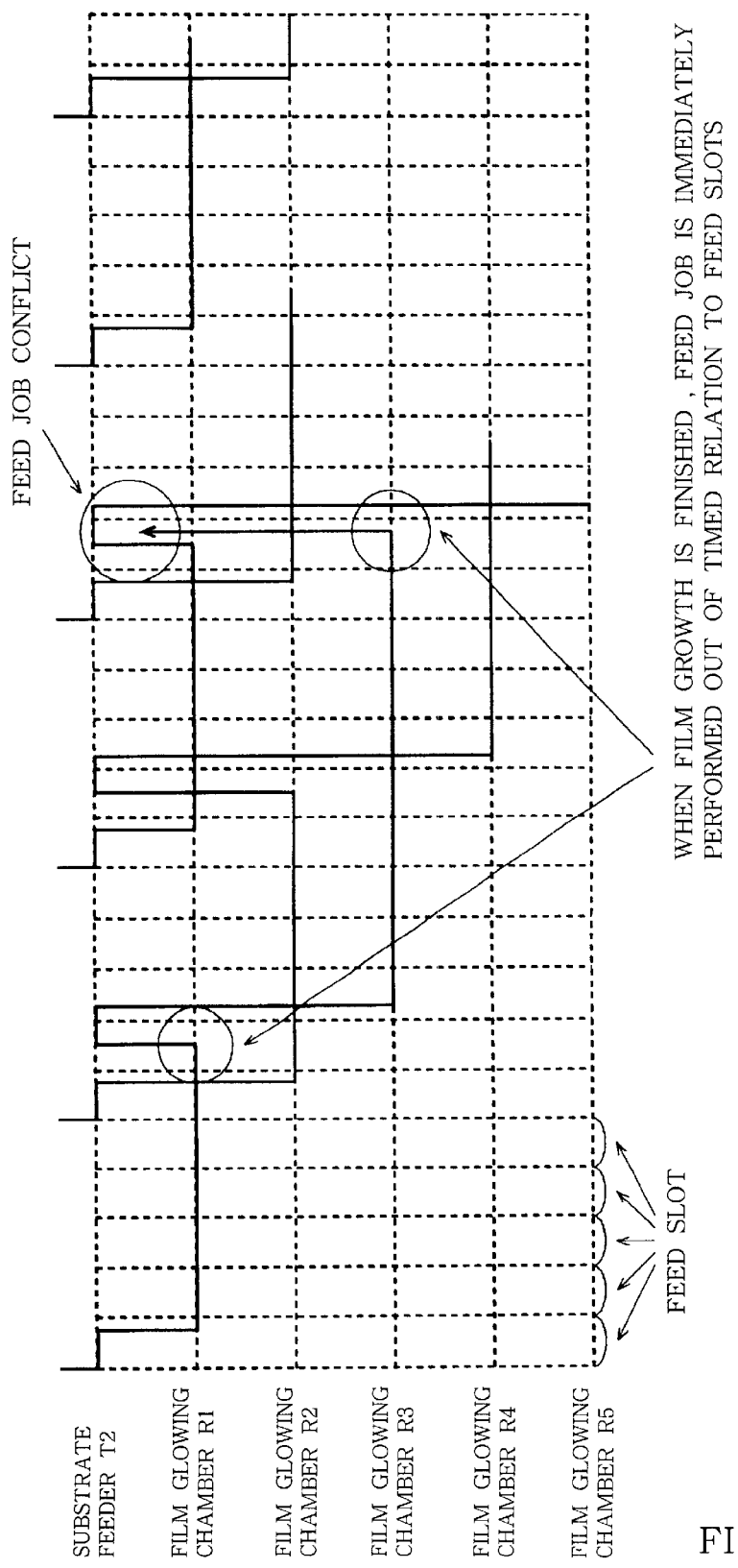
FIG. 11 is a timing chart illustrative of the generation of a feed job conflict.

It is important that the first and second substrate feeders T1, T2 perform their feed jobs in each tact time in timed relation to the feed slots. Even if a substrate feeder which is in a standby condition when a film growing process is completed in a film growing chamber can start a feed job, a feed job conflict tends to occur if the substrate feeder attempts to start a feed job when a film growing process is completed in a next film growing chamber. For example, as shown in FIG. 11, if a feed job is started immediately out of synchronism with feed slots when a film growing process is completed, a feed job conflict tends to take place.

Figure 12:
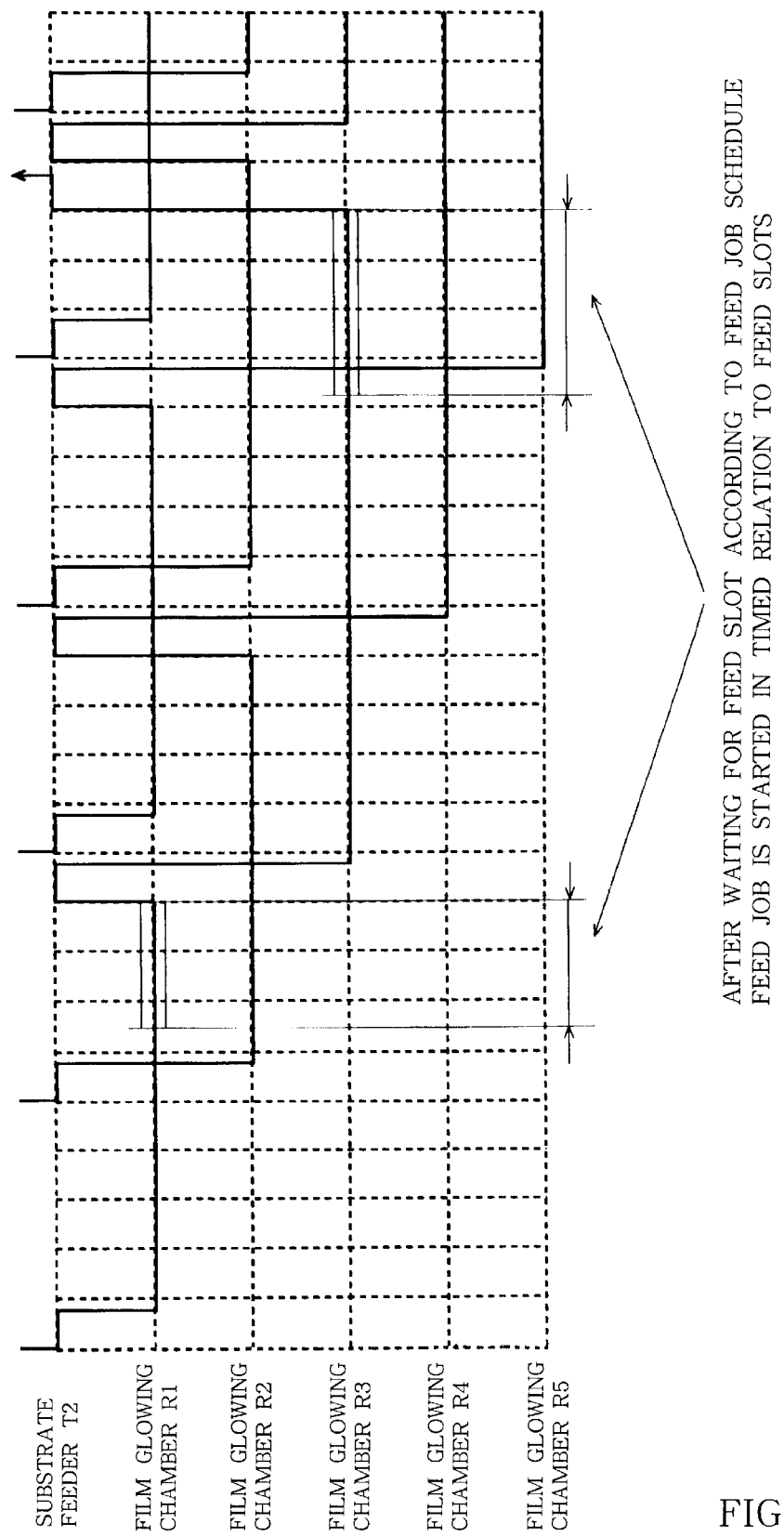
FIG. 12 is a timing chart illustrative of the avoidance of a feed job conflict.

To avoid such a feed job conflict, as shown in FIG. 12, even when a film growing process is completed, the controller C holds a feed job until a certain feed slot according to a feed job schedule, and starts the feed job in timed relation to the feed slots.

An LCD fabrication apparatus according to a second embodiment of the present invention will be described below.

Figure 13:
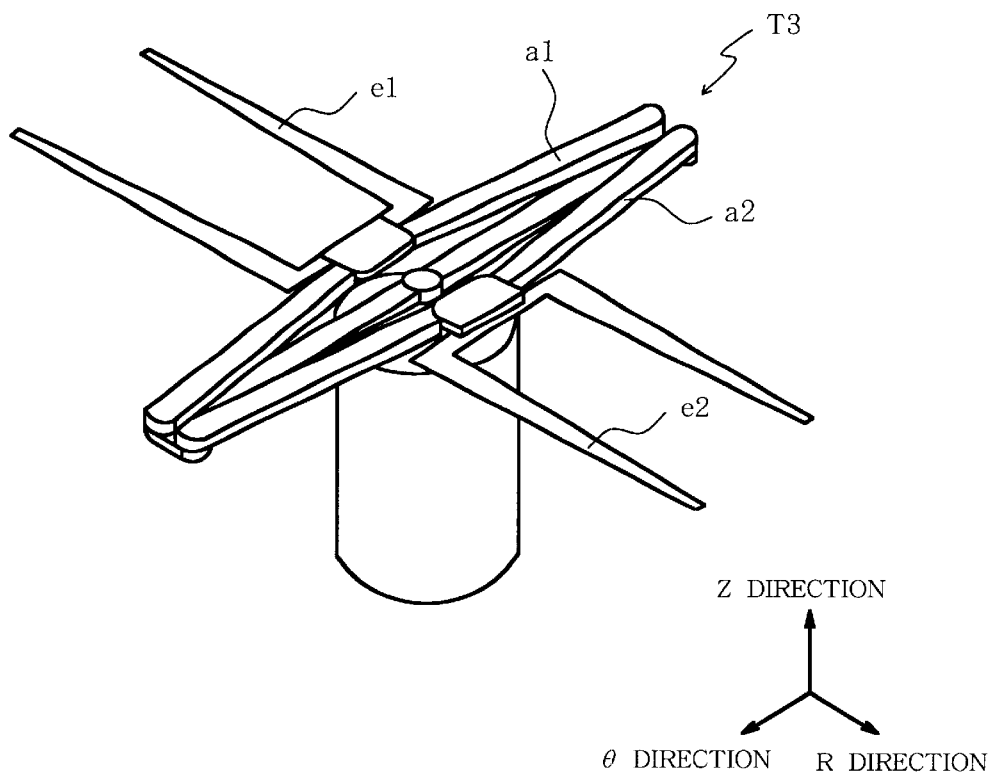
FIG. 13 is a perspective view of a substrate feeder according to a second embodiment of the present invention.

The LCD fabrication apparatus according to the second embodiment employs a robot arm T3 (see FIG. 13) having two end effectors e1, e2 as a substrate feeder for feeding substrates to processing chambers, in place of the second substrate feeder T2 shown in FIG. 1. As shown in FIG. 13, the robot arm or substrate feeder T3 comprises a pair of arms a1, a2 extensible and contractable independently of each other, with the end effectors e1, e2 being connected respectively to the arms a1, a2. The arms a1, a2 are rotatable about a central axis for changing the directions of the end effectors e1, e2.

The substrate feeder T3 is effective in increasing the processing chamber availability and throughput for the following reasons:

The substrate feeder T2 according to the first embodiment has only one end effector e and can hold one substrate at a time unless it has a number of holder layers. For the single end effector to feed a substrate from a processing chamber (represented by A) to another processing chamber (represented by B), the end effector needs to feed a substrate from the processing chamber B and thereafter to feed a substrate from the processing chamber A to the processing chamber B. Therefore, the end effector is required to operate in different feed slots. Stated otherwise, the end effector cannot feed a substrate into the processing chamber B unless the processing chamber B is emptied. Consequently, the basic feed sequence is such that substrates need to be fed along feed paths from the downstream side thereof.

Because of the above limitation, the time required to remove a substrate from the processing chamber B and introduce a next substrate into the processing chamber B is a relatively long as it is the sum of the time required to remove a substrate from the processing chamber B and feed the removed substrate to another processing chamber and the time required to remove a next substrate from the processing chamber A and introduce the substrate into the processing chamber B.

A longer period of time in which a substrate is kept out of a processing chamber means that a substrate processing time in the processing chamber is shorter within one process cycle time which is set as short as possible for a higher throughput. Since the time required for feed jobs is longer and the substrate processing time is shorter, resulting in a reduction in the processing chamber availability and also a reduction in the efficiency with which substrate products are manufactured. LCD fabrication processes require strict uniformity with respect to the amount of processing and processing details, and need as long a processing time as possible for the production of high-quality substrate products.

According to the second embodiment, the substrate feeder T3 can hold two substrates respectively with the end effectors e1, e2. Therefore, the substrate feeder T3 can remove and deliver a substrate from a processing chamber (picking action) and introduce and load a next substrate into the processing chamber (placing action) in a feed job in timed relation to one feed slot (one feed command) by switching around the directions of the end effectors e1, e2.

Specifically, the substrate feeder T3 starts executing a feed command while holding a next substrate on one of the end effectors. A substrate in the processing chamber B is picked up by the other end effector, and the next substrate is placed into the processing chamber B by the one of the end effectors. Because the next substrate is placed into the processing chamber B immediately after the previous substrate is picked up from the processing chamber B, the time required to replace the substrate is shorter than with the substrate feeder T2, thus increasing the processing chamber availability.

Figure 14:
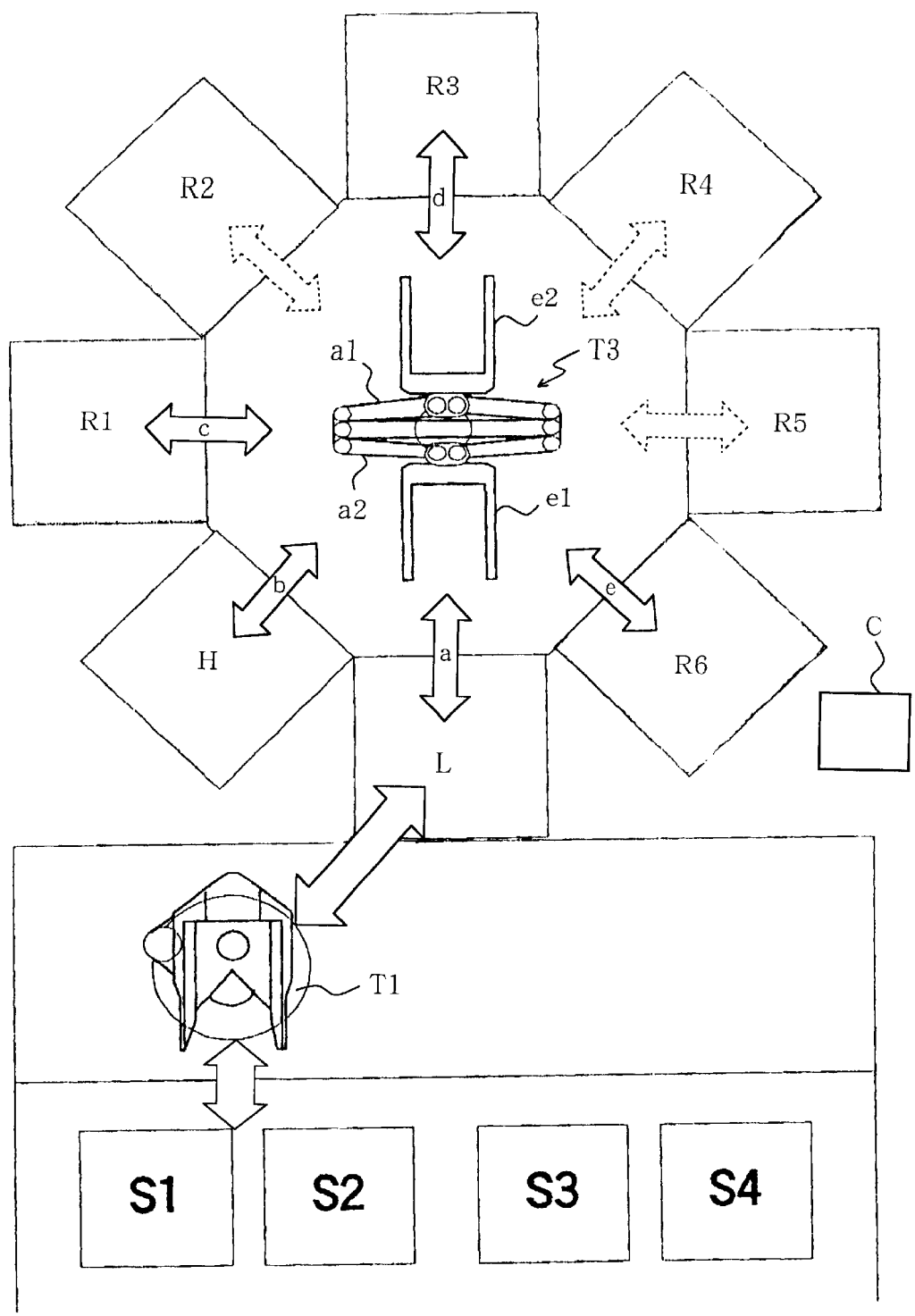
FIG. 14 is a schematic plan view of an LCD fabrication apparatus of the single-substrate cluster type which employs the substrate feeder shown in FIG. 13.
Figure 16:
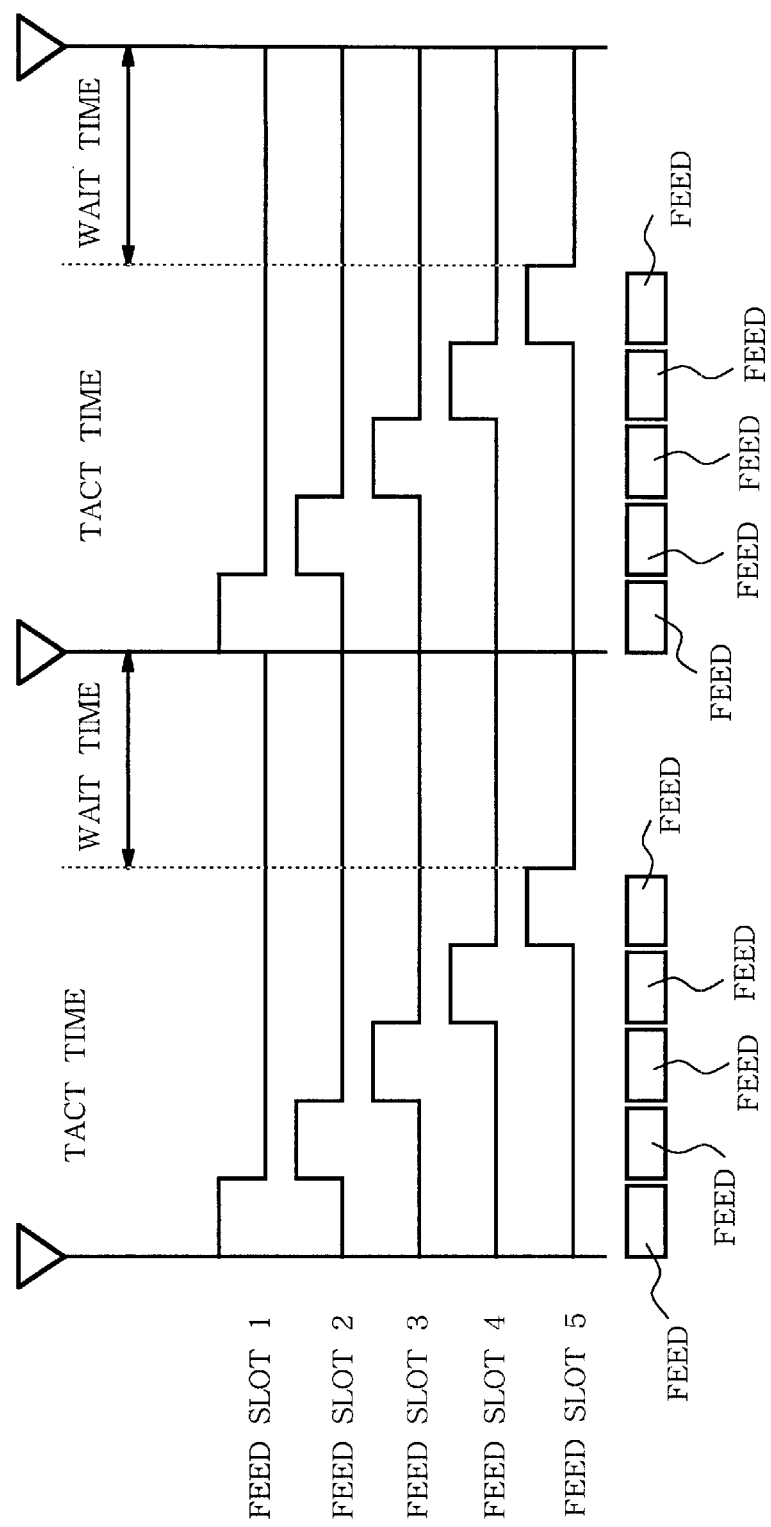
FIG. 16 is a timing chart of a feeding process based on a feed job schedule.
Figure 17:
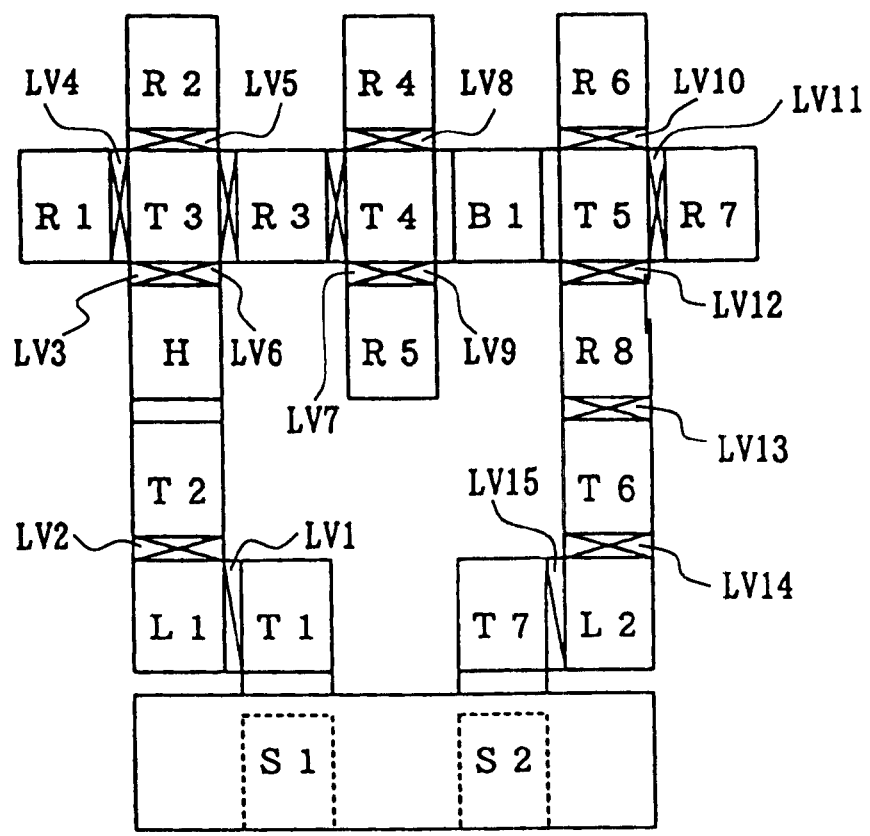
FIG. 17 is a schematic plan view of a known LCD fabrication apparatus of the single-substrate in-line type.

FIG. 14 shows the LCD fabrication apparatus of the single-substrate cluster type which employs the substrate feeder T3 shown in FIG. 13. The LCD fabrication Ad apparatus shown in FIG. 14 is controlled by a controller C for the feeding of substrates and the fabrication of substrate products in the LCD fabrication apparatus.

The substrate feeder T3 in the LCD fabrication apparatus serves to feed substrates between processing chambers coupled to a main frame through picking and placing actions thereof.

The LCD fabrication apparatus includes an auxiliary substrate loading and unloading chamber L, an auxiliary substrate heating chamber H, and first through sixth film growing chambers R1–R6 which are coupled to the main frame. The first and second film growing chambers R1, R2 belong to a first film growing chamber group for growing identical films on substrates concurrently, and the third, fourth, and fifth film growing chambers R3, R4, R5 belong to a second film growing chamber group for growing identical films on substrates concurrently. The sixth film growing chamber R6 belongs to a third film growing chamber group for growing another film on a substrate.

Gate valves associated with the processing chambers are omitted from illustration for the sake of brevity. Cassette stands S1–S4 and a first substrate feeder T1 are identical to those shown in FIG. 1.

The controller C calculates and establishes a tact time, feed slots, feed routes, and feed job schedules, and controls the first and second substrate feeders T1, T3 to effect feed jobs in timed relation to feet slots of the feed job schedules for thereby loading substrates successively from the cassette stands into the auxiliary substrate loading and unloading chamber L in tact times, feeding substrates successively through the first, second, and third film growing chamber groups, and unloading substrates from the auxiliary substrate loading and unloading chamber L to the cassette stands.

Figure 15:
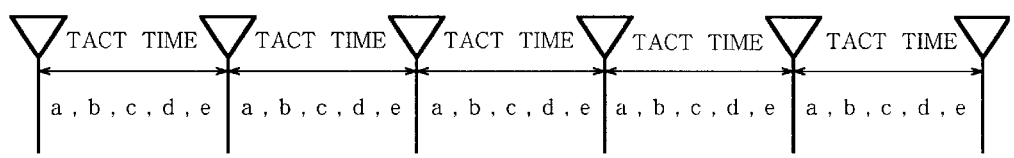
FIG. 15 is a diagram of a feed job schedule.

Since the substrate feeder T3 effects its picking and placing actions in one feed slot, the controller C can arrange feed slots successively downstream with respect to the first, second, and third film growing chamber groups in each tact time, as shown in FIG. 15, and control the substrate feeder T3 to carry out its feed jobs downstream with respect to the first, second, and third film growing chamber groups in each tact time.

Specifically, in each tact time, the substrate feeder T3 makes picking and placing actions ("a") with respect to the auxiliary substrate loading and unloading chamber L, picking and placing actions ("b") with respect to the auxiliary substrate heating chamber H, picking and placing actions ("c") with respect to either one of the film growing chambers of the first film growing chamber group, picking and placing actions ("d") with respect to either one of the film growing chambers of the second film growing chamber group, and picking and placing actions ("e") with respect to the third film growing chamber group, successively in the order named.

A tact time T in the second embodiment is calculated according to the following equation (2):

$$AT \geq P+R+B+2N \quad (2)$$

where A, T, B, N, R represent the same quantities as those in the first embodiment. The equation (2) is obvious because $2T \geq N_1+B_1+N_2+P+R=N+B+N+P+R$ since the substrate feeder T3 effects its picking and placing actions successively as a single action unlike the operation of the substrate feeder T2 to feed a substrate into the film growing chamber R1 in FIG. 2. Therefore, the tact time T is shorter by (B+N)/A which is the division of (B+N) corresponding to one feed action by the number A of parallel processing chambers.

In the second enbodiment, as stated above, since the sequence of feed routes is reversed and the substrate feeder T3 makes picking and placing actions in timed relation to a feed command in each tact time, substrates can be fed smoothly for the manufacture of high-quality substrate products in the tact time and feed slots described above with respect to the first embodiment. In the second embodiment, further improvements are added to manufacture higher-quality substrate products with a higher throughput.

Specifically, if the substrate feeder T2 with the single end effector is employed, then the controller C divides a tact time by the maximum number of feed jobs possible in the tact time, and uses the quotient (time) as a feed slot. If the substrate feeder T3 with the plural end effectors is employed, then the controller C establishes the sum of the time required for the substrate feeder T3 to effect a feed job and the time required to transmit a feed command to the substrate feeder T3 for performing the feed job is used as a feed slot, and issues a feed command in synchronism with the feed slot to operate the substrate feeder T3.

For example, if the tact time is 111 seconds, the time required to execute a feed command (feed job time) is 18 seconds, and the network communication time is 1 second, then the time slot for the substrate feeder T2 is 22.2 seconds, as described above, but the time slot for the substrate feeder T3 is (18+1)=19 seconds, and the controller C issues a feed command in synchronism with the time slot.

The feed slot is set to a short time because the substrate feeder T3 holds a picked substrate with its picking and placing actions until a next feed slot, and the heating history of the substrate would be adversely affected if the time in which the substrate feeder T3 holds the substrate were longer. In order to give a margin to the substrate feed time, a certain marginal time may be added to the feed time and the feed command transmission time, thus calculating a feed slot. Since the feed job time is shortened, the processing chamber dwell time is increased in one process cycle, resulting in an increase in the processing chamber availability.

If feed slots are successively arranged depending on feed routes within a tact time, then since the feed slots are shortened, there is generated a wait time free of feed slots after feed slots 1–5, i.e., the feed jobs "a"–"e", are finished in a preceding tact time, until a next tact time is started. With the wait time generated, a substrate picked up from the final processing chamber R6 by the feed job remains held by an end effector. Inasmuch as this substrate has been processed and needs to be returned to the normal temperature, its heating history will not be adversely affected. Rather, it is advantageous for the processed substrate to be cooled on the end effector. Insofar as the heating history will not be adversely affected, the feed slots may not be successively arranged, but may be spaced with idle times interposed.

The process of controlling the feeding of substrates and the process of manufacturing substrate products, as described above, are controlled by the controller C which is software-operated to make automatic calculations to calculate a tact time, control processing times in film growing chambers, and control feed jobs in timed relation to feed slots. However, the above processes may be controlled by hardware arrangements which perform the same calculating and controlling functions.

In the second embodiment, the substrate feeder T3 comprises a robot arm having two end effectors for effecting picking and placing actions. However, the substrate feeder may comprise a substrate feeder having two or more holders or any of various other feeders capable of feeding substrates.

The principles of the present invention are applicable to substrate processing apparatus of the single-substrate in-line type. The substrate processing apparatus of the single-substrate in-line type differ from the substrate processing apparatus of the single-substrate cluster type in that a substrate feeder is associated with each of the processing chambers. The concept of the tact time according to the present invention is applicable to the substrate processing apparatus of the single-substrate in-line type. The present invention is applicable to any fabrication apparatus in which substrates need to be fed to a plurality of processing chambers including film growing chambers and buffer chambers by one substrate feeder. Therefore, the number of processing chambers in the cluster and the number of corners of the cluster are not limited in the substrate processing apparatus of the single-substrate cluster type. The principles of the present invention are also applicable to substrate processing apparatus in which a plurality of substrates need to be fed and processed at a time.

According to the present invention, as described above, a tact time is calculated as a time which is equal to or greater than a maximum one of values produced by dividing times required to process substrates to grow films thereon and times required to feed substrates, by the number of processing chambers, and a substrate is loaded into a substrate processing apparatus in each tact time. Accordingly, substrates can smoothly be fed in the substrate processing apparatus.

A time equal to or greater than the time required to perform a feed job is assigned to a feed slot, and a plurality of feed slots are set up in a tact time. Since substrates are fed in timed relation to the feed slots, the substrates can be fed optimally without a feed job conflict, and the throughput is increased.

Because substrates are fed in timed relation to the feed slots, the time in which a substrate stays in each processing chamber is made as long as possible for reducing and making constant a heating history of substrates, so that the quality of resultant substrate products is increased.

Optimum feed job schedules are established to maximize the film growing chamber dwell time for an effective film growing process.

If a substrate feeder having a plurality of holders for performing picking and placing actions is employed, then substrates may be cooled in a wait time produced by reducing feed slots, and the throughput may further be increased by shortening the tact time.

Although certain preferred embodiments of the present invention have been shown and described in detail, it should be understood that various changes and modifications may be made therein without departing from the scope of the appended claims.

What is claimed is:

1. A method of controlling the feeding of substrates in a substrate processing apparatus having a plurality of processing chamber groups including at least one processing chamber group of a plurality of processing chambers for identically processing substrates concurrently therein, and a single substrate feeder for feeding substrates to the processing chamber groups, the method comprising the steps of:

calculating respective times for the processing chamber groups by dividing the sums of times required to process substrates in the processing chambers and times required to feed substrates to the processing chambers, by the number of the processing chambers included in said processing chamber groups;

establishing a time equal to or greater than a maximum one of the calculated times of each of the chamber groups, as a tact time;

loading substrates to be processed into said substrate processing apparatus with the substrate feeder at intervals of said tact time;

establishing a time equal to or greater than a time required for the substrate feeder to perform a feed job as a feed slot;

establishing, in each tact time, a feed job schedule of feed slots assigned to feed jobs with respect to the processing chamber groups;

feeding substrates into said substrate processing apparatus with said substrate feeder in timed relation to said feed slots according to said feed job schedule, wherein said substrate feeder has at least two holders for holding and feeding substrates at a time, said two holders being alternately operable to introduce substrates into or remove substrates from respective ones of said processing chambers at a time in each feed slot;

establishing a sequence to feed a substrate to either one of the processing chambers of a first of the processing chamber groups, to feed a substrate from said either one of the processing chambers of the first processing chamber group to either one of the processing chambers of a second of the processing chamber groups and to unload a substrate from the second processing chamber group, said feed slots being arranged according to said sequence in said feed job schedule in each tact time;

repeating feed job schedules in respective tact time to feed substrates to the processing chambers according to said sequence;

adding a time required to transmit a feed command to the substrate feeder to perform a feed job to the time required for the substrate feeder to perform the feed job; and establishing the added times as the feed slot.

2. A method according to claim 1, wherein said feed job schedule is established so as to incorporate an inhibiting condition to inhibit feed jobs while the substrate processing apparatus is in operation.

3. A method according to claim 1, wherein each of said processing chambers comprises a film growing chamber for growing a film on a substrate, and said feed job schedule is established so as to maximize the margin of a film growing chamber dwell time in which a substrate stays in each film growing chamber with respect to a film growing time, and also to maximize the sum of film growing chamber dwell times in the film growing chambers.

4. A method of controlling the feeding of substrates in a substrate processing apparatus having a plurality of processing chamber groups including at least one processing chamber group of a plurality of processing chambers for identically processing substrates concurrently therein, and a single substrate feeder for feeding substrates to the processing chamber groups, the method comprising the steps of:

calculating respective times for the processing chamber groups by dividing the sums of times required to process substrates in the processing chambers and times required to feed substrates to the processing chambers, by the number of the processing chambers included in said processing chamber groups;

establishing a time equal to or greater than a maximum one of the calculated times of each of the chamber groups, as a tact time;

loading substrates to be processed into said substrate processing apparatus with the substrate feeder at intervals of said tact time;

establishing a time equal to or greater than a time required for the substrate feeder to perform a feed job as a feed slot;

establishing, in each tact time, a feed job schedule of feed slots assigned to feed jobs with respect to the processing chamber groups;

feeding substrates into said substrate processing apparatus with said substrate feeder in timed relation to said feed slots according to said feed job schedule, wherein said substrate feeder has at least two holders for holding and feeding substrates at a time, said two holders being alternately operable to introduce substrates into or remove substrates from respective ones of said processing chambers at a time in each feed slot;

establishing a sequence to feed a substrate to either one of the processing chambers of a first of the processing chamber groups, to feed a substrate from said either one of the processing chambers of the first processing chamber group to either one of the processing chambers of a second of the processing chamber groups and to unload a substrate from the second processing chamber group, said feed slots being arranged according to said sequence in said feed job schedule in each tact time;

repeating feed job schedules in respective tact time to feed substrates to the processing chambers according to said sequence, wherein said substrate processing apparatus has another substrate feeder for loading substrates to be processed into the substrate processing apparatus and unloading processed substrates from the substrate processing apparatus;

adding, to said feed job schedule in each tact time, feed slots for the another substrate feeder to load substrates into the substrate processing apparatus, prior to slots for the other substrate feeder to unload substrates from the substrate processing apparatus; and repeating feed job schedules in respective tact time to repeatedly load substrates into the substrate processing apparatus and unload substrates from the substrate processing apparatus.

5. A method according to claim 4, wherein said feed job schedule is established so as to incorporate an inhibiting condition to inhibit feed jobs while the substrate processing apparatus is in operation.

6. A method according to claim 4, wherein each of said processing chambers comprises a film growing chamber for growing a film on a substrate, and said feed job schedule is established so as to maximize the margin of a film growing chamber dwell time in which a substrate stays in each film growing chamber with respect to a film growing time, and also to maximize the sum of film growing chamber dwell times in the film growing chambers.

* * * * *